(12) United States Patent
Cho

(10) Patent No.: US 11,257,873 B2
(45) Date of Patent: Feb. 22, 2022

(54) DISPLAY PANEL, AND DISPLAY DEVICE HAVING AN IGZO LAYER

(71) Applicants: HKC Corporation Limited, Shenzhen (CN); Chongqing HKC Optoelectronics Technology Co., ltd., Chongqing (CN)

(72) Inventor: En-Tsung Cho, Chongqing (CN)

(73) Assignees: HKC CORPORATION LIMTTED, Shenzhen (CN); CHONGQING HKC OPTOELECTRONICS TECHNOLOGY CO., LTD., Chongqing (CN)

( * ) Notice: Subject to any disclaimer, the term of this patent is extended or adjusted under 35 U.S.C. 154(b) by 207 days.

(21) Appl. No.: 16/349,594

(22) PCT Filed: Jun. 25, 2018

(86) PCT No.: PCT/CN2018/092601
§ 371 (c)(1),
(2) Date: May 13, 2019

(87) PCT Pub. No.: WO2019/148748
PCT Pub. Date: Aug. 8, 2019

(65) Prior Publication Data
US 2020/0266249 A1  Aug. 20, 2020

(30) Foreign Application Priority Data

Feb. 5, 2018 (CN) .......................... 201810115561.4

(51) Int. Cl.
*H01L 51/50* (2006.01)
*H01L 27/32* (2006.01)
*H01L 31/0352* (2006.01)

(52) U.S. Cl.
CPC ...... *H01L 27/3227* (2013.01); *H01L 27/3262* (2013.01); *H01L 51/502* (2013.01);
(Continued)

(58) Field of Classification Search
CPC ............. H01L 27/3227; H01L 27/3262; H01L 51/502; H01L 31/035218; H01L 2251/5369; H01L 2251/308
See application file for complete search history.

(56) References Cited

U.S. PATENT DOCUMENTS 8,188,477 B2 * 5/2012 Miyairi ............... H01L 29/7869
257/59
8,384,079 B2 * 2/2013 Yamazaki ........... H01L 27/1248
257/43
(Continued)

FOREIGN PATENT DOCUMENTS

CN  101604085 A  12/2009
CN  101753861 A  6/2010
(Continued)

OTHER PUBLICATIONS

International Search Report issued in corresponding International application No. PCT/CN2018/092601, dated Oct. 19, 2018.
(Continued)

*Primary Examiner* — Ida M Soward

(57) ABSTRACT

The present application provides a display panel and a display device. The display panel includes a substrate; an active switch, which is disposed on the substrate and includes a first active switch, a second active switch, and an indium gallium zinc oxide layer; a pixel, which is disposed on the substrate and coupled to the first active switch and includes a quantum dot light-emitting diode; and a light sensor, which is disposed on the substrate and coupled to the second active switch and includes a quantum dot light sensing layer; where the active switch includes a gate layer,
(Continued)

a gate insulating layer, the indium gallium zinc oxide layer, an etch stop layer, a metal layer, and a pixel electrode layer which are sequentially arranged on the substrate.

20 Claims, 3 Drawing Sheets

(52) U.S. Cl.
CPC .............. *H01L 31/035218* (2013.01); *H01L 2251/308* (2013.01); *H01L 2251/5369* (2013.01)

(56) References Cited

U.S. PATENT DOCUMENTS

| | | | |
|---|---|---|---|
| 9,012,900 B2* | 4/2015 | Beak | H01L 27/3246 257/40 |
| 9,316,695 B2* | 4/2016 | Takahashi | G01R 31/3833 |
| 9,589,995 B2* | 3/2017 | Shi | H01L 29/78618 |
| 9,806,200 B2* | 10/2017 | Shimomura | H01L 29/7869 |
| 9,852,926 B2* | 12/2017 | Akimoto | H01L 21/46 |
| 9,917,209 B2* | 3/2018 | Endo | H01L 27/092 |
| 9,923,002 B2* | 3/2018 | Li | H01L 29/45 |
| 10,031,392 B2* | 7/2018 | Nakada | H01L 27/1255 |
| 10,083,990 B2* | 9/2018 | Oh | H01L 27/1255 |
| 10,170,503 B2* | 1/2019 | Liang | H01L 27/1251 |
| 10,276,594 B2* | 4/2019 | Yamazaki | H01L 29/78696 |
| 10,297,694 B2* | 5/2019 | Ito | H01L 29/786 |
| 10,340,323 B2* | 7/2019 | Nie | H01L 27/3246 |
| 10,345,661 B2* | 7/2019 | Miyake | G06F 3/041 |
| 10,355,064 B2* | 7/2019 | Gai | H01L 21/77 |
| 10,361,226 B2* | 7/2019 | Shi | H01L 29/7869 |
| 10,367,096 B2* | 7/2019 | Yamazaki | H01L 27/0688 |
| 10,381,381 B1* | 8/2019 | Choi | H01L 27/1248 |
| 10,459,304 B2* | 10/2019 | Watakabe | H01L 27/1251 |
| 10,790,318 B2* | 9/2020 | Yamazaki | G02F 1/1368 |
| 10,854,837 B2* | 12/2020 | Kim | G09G 3/3233 |
| 10,957,801 B2* | 3/2021 | Nakazawa | H01L 21/02274 |
| 10,964,252 B2* | 3/2021 | Katayama | H01L 29/78696 |
| 11,099,814 B2* | 8/2021 | Harada | G06N 3/04 |
| 2016/0005799 A1* | 1/2016 | Wang | H01L 27/32 257/40 |
| 2017/0040402 A1* | 2/2017 | Yasumoto | H01L 27/3258 |
| 2017/0256654 A1* | 9/2017 | Yamazaki | G06F 1/1652 |
| 2017/0351424 A1* | 12/2017 | Murata | G06F 3/0481 |
| 2018/0005567 A1* | 1/2018 | Takahashi | G09G 3/32 |
| 2019/0157461 A1* | 5/2019 | Yamazaki | H01L 29/78693 |
| 2020/0176719 A1* | 6/2020 | Cho | H01L 31/105 |

FOREIGN PATENT DOCUMENTS

| | | |
|---|---|---|
| CN | 104299520 A | 1/2015 |
| CN | 104299973 A | 1/2015 |
| CN | 105720176 A | 6/2016 |
| CN | 106653773 A | 5/2017 |
| WO | 2015194870 A1 | 12/2015 |
| WO | 2017054887 A1 | 4/2017 |
| WO | 2017202180 A1 | 11/2017 |

OTHER PUBLICATIONS

Written opinion of the International Search Authority in corresponding International application No. PCT/CN2018/092601, dated Oct. 19, 2018.
First Office Action from China patent office in a counterpart Chinese patent Application 201810115561.4, dated Mar. 19, 2020 (9 pages).

* cited by examiner

DISPLAY PANEL, AND DISPLAY DEVICE HAVING AN IGZO LAYER

This application claims priority to Chinese Patent Application No. CN 2018101155614, filed with the Chinese Patent Office on Feb. 2, 2018 and entitled "DISPLAY PANEL AND DISPLAY DEVICE", which is incorporated herein by reference in its entirety.

TECHNICAL FIELD

The present application relates to the technical field of display, and in particular, to a display panel and a display device.

BACKGROUND

Existing displays are generally controlled based on active switches, and have many advantages such as thin bodies, power saving and no radiation, and have been widely used, mainly including a liquid crystal display, an organic light-emitting diode (OLED) display, a quantum dot light-emitting diode (QLED) display, a plasma display and the like. From the perspective of the appearance structure, there are flat displays and curved displays.

The liquid crystal display includes a liquid crystal panel and a backlight module. The working principle of the liquid crystal display is that liquid crystal molecules are placed between two parallel glass substrates and a driving voltage is applied on the two glass substrates to control the rotating direction of the liquid crystal molecules, so as to refract light of the backlight module to generate a picture.

For the OLED display, the self-illumination of an organic light-emitting diode is used for display, and the OLED display has the advantages of self-illumination, wide viewing angle, almost infinite contrast, low power consumption, and extremely high reaction speed and the like.

The structure of the QLED display is very similar to that of an OLED technology. The main difference is that a luminescent center of the QLED is composed of quantum dots. Its structure is that after two-side electrons and holes converge in a quantum dot layer, photons (exciton) are formed, and the QLED display emits light by recombination of the photons.

However, with the gradual development of liquid crystal display (LCD) products, how to make LCDs have better performance has become the direction of thinking and improvement. An example is how to make better use of the quantum dot technology.

It should be noted that the above description of the technical background is only for the purpose of facilitating a clear and complete description of the technical solutions of the present application, and facilitates understanding by a person skilled in the art. Although these solutions are set forth in the background section of the present application, it should not be considered simply that the above technical solutions are known to a person skilled in the art.

SUMMARY

An objective of the present application is to provide a display panel having a better adjustment effect.

To solve the above problem, the present application provides a display panel, including:

a substrate;

an active switch, which is disposed on the substrate and includes a first active switch and a second active switch;

a pixel, which is disposed on the substrate and coupled to the first active switch and includes a quantum dot light-emitting diode; and a light sensor, which is disposed on the substrate and coupled to the second active switch and includes a quantum dot light sensing layer;

where the active switch includes a gate layer, a gate insulating layer, an indium gallium zinc oxide layer, an etch stop layer, a metal layer, and a pixel electrode layer which are sequentially arranged on the substrate.

Optionally, the light sensor is a PIN type photodiode.

Optionally, the quantum dot light-emitting diode includes a cathode layer, a quantum dot film, and an anode layer which are sequentially arranged from the direction of the substrate.

Optionally, the quantum dot light-emitting diode is disposed above the etch stop layer, the quantum dot film is disposed between the metal layer and the pixel electrode layer, the pixel electrode layer is used as an anode of the quantum dot film, and the metal layer serves as a cathode of the quantum dot film.

Optionally, via holes are formed in the etch stop layer, and the metal layer is connected to the indium gallium zinc oxide layer through the via holes.

Optionally, the quantum dot light-emitting diode includes a cathode layer, a quantum dot film, and an anode layer which are sequentially arranged from the direction of the substrate;

the quantum dot light-emitting diode is disposed above the etch stop layer, the quantum dot film is disposed between the metal layer and the pixel electrode layer, the pixel electrode layer is used as an anode of the quantum dot film, and the metal layer serves as a cathode of the quantum dot film;

via holes are formed in the etch stop layer, and the metal layer is connected to the indium gallium zinc oxide layer through the via holes.

Optionally, the quantum dot light sensing layer includes a mesoporous framework, the mesoporous framework is a self-assembled mesoporous silica framework, holes are formed in the mesoporous framework, and quantum dots are disposed in the holes.

Optionally, the hole has a diameter of 2-7 nm.

Optionally, the inner wall of the hole is a silicon dioxide hole wall, and the hole wall has a thickness of 1-2 nm.

Optionally, the holes include a plurality of first holes, second holes and third holes, where the diameter of the second hole is smaller than that of the first hole, and the diameter of the third hole is smaller than that of the second hole.

Optionally, the quantum dot light-emitting diode includes a cathode layer, a quantum dot film, and an anode layer which are sequentially arranged from the direction of the substrate;

the quantum dot light-emitting diode is disposed above the etch stop layer, the quantum dot film is disposed between the metal layer and the pixel electrode layer, the pixel electrode layer is used as an anode of the quantum dot film, and the metal layer serves as a cathode of the quantum dot film;

via holes are formed in the etch stop layer, and the metal layer is connected to the indium gallium zinc oxide layer through the via holes.

The quantum dot light sensing layer includes a mesoporous framework, the mesoporous framework is a self-assembled mesoporous silica framework, holes are formed in the mesoporous framework, and quantum dots are disposed in the holes;

the hole has a diameter of 2-7 nm;

the inner wall of the hole is a silicon dioxide hole wall, and the hole wall has a thickness of 1-2 nm.

The present application also discloses a display panel, which includes:

a substrate;

an active switch, which is disposed on the substrate, includes a first active switch and a second active switch, and includes an indium gallium zinc oxide layer;

a pixel, which is disposed on the substrate and coupled to the first active switch and includes a quantum dot light-emitting diode; and a light sensor, which is disposed on the substrate and coupled to the second active switch and includes a quantum dot light sensing layer;

where the quantum dot light-emitting diode includes a cathode layer, a quantum dot film, and an anode layer which are sequentially arranged from the direction of the substrate:

where the active switch includes a gate layer, a gate insulating layer, the indium gallium zinc oxide layer, an etch stop layer, a metal layer, and a pixel electrode layer which are sequentially arranged on the substrate;

the quantum dot light-emitting diode is disposed above the etch stop layer, the quantum dot film is disposed between the metal layer and the pixel electrode layer, the pixel electrode layer is used as an anode of the quantum dot film, and the metal layer serves as a cathode of the quantum dot film.

The present application also discloses a display device, which includes:

a control component and a display panel;

the display panel includes:

a substrate;

an active switch, which is disposed on the substrate and includes a first active switch and a second active switch;

a pixel, which is disposed on the substrate and coupled to the first active switch and includes a quantum dot light-emitting diode; and a light sensor, which is disposed on the substrate and coupled to the second active switch and includes a quantum dot light sensing layer;

where the active switch includes a gate layer, a gate insulating layer, an indium gallium zinc oxide layer, an etch stop layer, a metal layer, and a pixel electrode layer which are sequentially arranged on the substrate.

Optionally, the light sensor is a PIN type photodiode.

Optionally, the quantum dot light-emitting diode includes a cathode layer, a quantum dot film, and an anode layer which are sequentially arranged from the direction of the substrate;

the quantum dot light-emitting diode is disposed above the etch stop layer, the quantum dot film is disposed between the metal layer and the pixel electrode layer, the pixel electrode layer is used as an anode of the quantum dot film, and the metal layer serves as a cathode of the quantum dot film.

Optionally, via holes are formed in the etch stop layer, and the metal layer is connected to the indium gallium zinc oxide layer through the via holes.

Optionally, the quantum dot light-emitting diode includes a cathode layer, a quantum dot film, and an anode layer which are sequentially arranged from the direction of the substrate;

the quantum dot light-emitting diode is disposed above the etch stop layer, the quantum dot film is disposed between the metal layer and the pixel electrode layer, the pixel electrode layer is used as an anode of the quantum dot film, and the metal layer serves as a cathode of the quantum dot film;

via holes are formed in the etch stop layer, and the metal layer is connected to the indium gallium zinc oxide layer through the via holes.

Optionally, the quantum dot light sensing layer includes a mesoporous framework, the mesoporous framework is a self-assembled mesoporous silica framework, holes are formed in the mesoporous framework, and quantum dots are disposed in the holes.

Optionally, the hole has a diameter of 2-7 nm;

the inner wall of the hole is a silicon dioxide hole wall, and the hole wall has a thickness of 1-2 nm.

Optionally, the quantum dot light-emitting diode includes a cathode layer, a quantum dot film, and an anode layer which are sequentially arranged from the direction of the substrate;

the quantum dot light-emitting diode is disposed above the etch stop layer, the quantum dot film is disposed between the metal layer and the pixel electrode layer, the pixel electrode layer is used as an anode of the quantum dot film, and the metal layer serves as a cathode of the quantum dot film;

via holes are formed in the etch stop layer, and the metal layer is connected to the indium gallium zinc oxide layer through the via holes.

The quantum dot light sensing layer includes a mesoporous framework, the mesoporous framework is a self-assembled mesoporous silica framework, holes are formed in the mesoporous framework, and quantum dots are disposed in the holes;

the hole has a diameter of 2-7 nm;

the inner wall of the hole is a silicon dioxide hole wall, and the hole wall has a thickness of 1-2 nm.

The holes include a plurality of first holes, second holes and third holes, where the diameter of the second hole is smaller than that of the first hole, and the diameter of the third hole is smaller than that of the second hole.

The quantum dot light sensing layer of the present application typically contains materials for fabricating light sensors such as photodiodes, and at the same time the quantum dot light sensing layer has spectral adjustability and environmental stability. The indium gallium zinc oxide layer serves as a channel layer in the active switch, and the indium gallium zinc oxide is amorphous, which solves the problem that the grain size limits the uniformity of the panel. At the same time, its driving voltage is very low and can be less than 1 V, thereby saving electricity and energy. By reasonable use of the device, the display taste is improved and the user's visual experience is enhanced.

BRIEF DESCRIPTION OF DRAWINGS

The drawings are included to provide further understanding of embodiments of the present application, which constitute a part of the specification and illustrate the embodiments of the present application, and describe the principles of the present application together with the text description. Apparently, the accompanying drawings in the following description show merely some embodiments of the present application, and a person of ordinary skill in the art may still derive other accompanying drawings from these accompanying drawings without creative efforts.

In the accompanying drawings.

DESCRIPTION OF EMBODIMENTS

Figure 1:
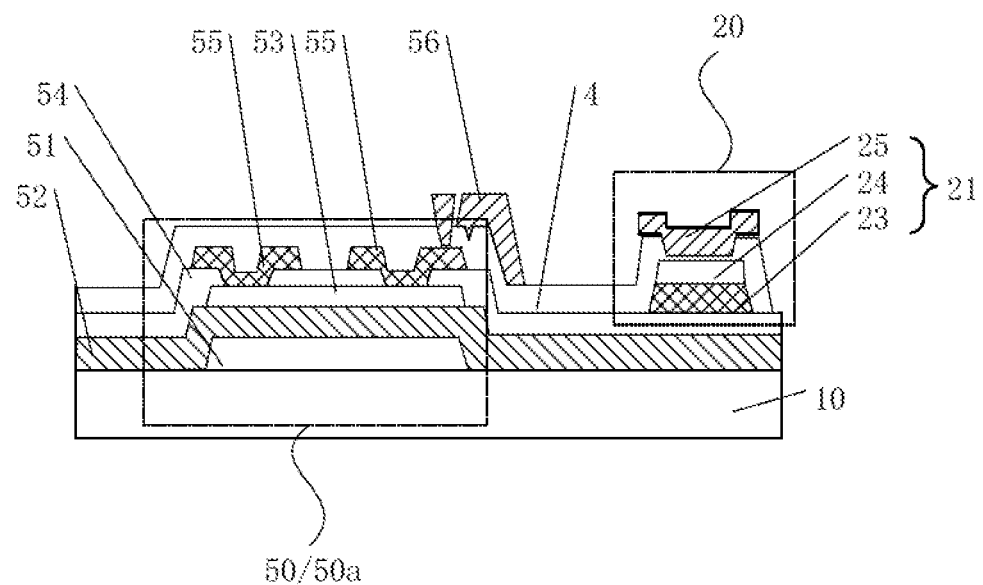
FIG. 1 is a schematic structural view of a first active switch of a display panel and a pixel of a display panel according to an embodiment of the present application.

The specific structure and function details disclosed herein are merely representative, and are intended to describe exemplary embodiments of the present application. However, the present application can be specifically embodied in many alternative forms, and should not be interpreted to be limited to the embodiments described herein.

In the description of the present application, it should be understood that, orientation or position relationships indicated by the terms "center", "transversal", "upper", "lower", "left", "right", "vertical", "horizontal", "top", "bottom", "inner", "outer", etc. are based on the orientation or position relationships as shown in the drawings, for ease of the description of the present application and simplifying the description only, rather than indicating or implying that the indicated device or element must have a particular orientation or be constructed and operated in a particular orientation. Therefore, these terms should not be understood as a limitation to the present application. In addition, the terms "first", "second" are merely for a descriptive purpose, and cannot to be understood to indicate or imply a relative importance, or implicitly indicate the number of the indicated technical features. Hence, the features defined by "first", "second" can explicitly or implicitly include one or more of the features. In the description of the present application, "a plurality of" means two or more, unless otherwise stated. In addition, the term "include" and any variation thereof are intended to cover a non-exclusive inclusion.

In the description of the present application, it should be understood that, unless otherwise specified and defined, the terms "install", "connected with", "connected to" should be comprehended in a broad sense. For example, these terms may be comprehended as being fixedly connected, detachably connected or integrally connected; mechanically connected or coupled; or directly connected or indirectly connected through an intermediate medium, or in an internal communication between two elements. The specific meanings about the foregoing terms in the present application may be understood for those skilled in the art according to specific circumstances.

The terms used herein are merely for the purpose of describing the specific embodiments, and are not intended to limit the exemplary embodiments. As used herein, the singular forms "a", "an" are intended to include the plural forms as well, unless otherwise indicated in the context clearly. It will be further understood that the terms "comprise" and/or "include" used herein specify the presence of the stated features, integers, steps, operations, elements and/or components, but do not preclude the presence or addition of one or more other features, integers, steps, operations, elements, components and/or combinations thereof.

In the figures, structurally similar units are denoted by the same reference numerals.

The display panel and the display device of the present application are described in further detail below with reference to the embodiments of FIGS. 1 to 5.

As an embodiment of the present application, as shown in FIG. 1 (including a passivation layer 4), the display panel includes:

a substrate 10;

an active switch 50, which is disposed on the substrate 10, includes a first active switch 50a and a second active switch 50b, and includes an indium gallium zinc oxide layer 53;

a pixel 20, which is disposed on the substrate 10 and coupled to the first active switch and includes a quantum dot light-emitting diode 21; and a light sensor 22 which is disposed on the substrate and coupled to the second active switch and includes a quantum dot light sensing layer 27.

The active switch includes a gate layer 51, a gate insulating layer 52, the indium gallium zinc oxide (IGZO) layer 53, an etch stop layer 54, a metal layer 55, and a pixel electrode layer 56 which are sequentially arranged on the substrate. The ambient light brightness is collected by the light sensor, and an optical signal is converted into an electrical signal, which is controlled by a signal processor, to achieve the purpose of adjusting the display brightness. The quantum dot light sensing layer typically contains materials for fabricating light sensors such as photodiodes, and at the same time the quantum dot light sensing layer has spectral adjustability and environmental stability. The indium gallium zinc oxide layer serves as a channel layer in the active switch, and the indium gallium zinc oxide is amorphous, which solves the problem that the grain size limits the uniformity of the panel. At the same time, its driving voltage is very low and can be less than 1 V, thereby saving electricity and energy. By reasonable use of the device, the display taste is improved and the user's visual experience is enhanced.

Figure 2:
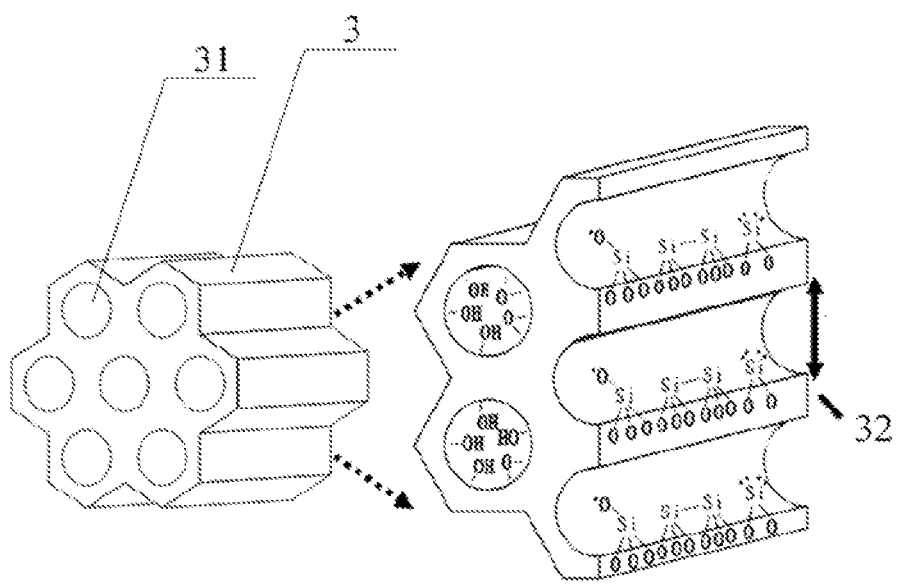
FIG. 2 is a schematic structural view of a mesoporous framework of a display panel according to an embodiment of the present application.
Figure 3:
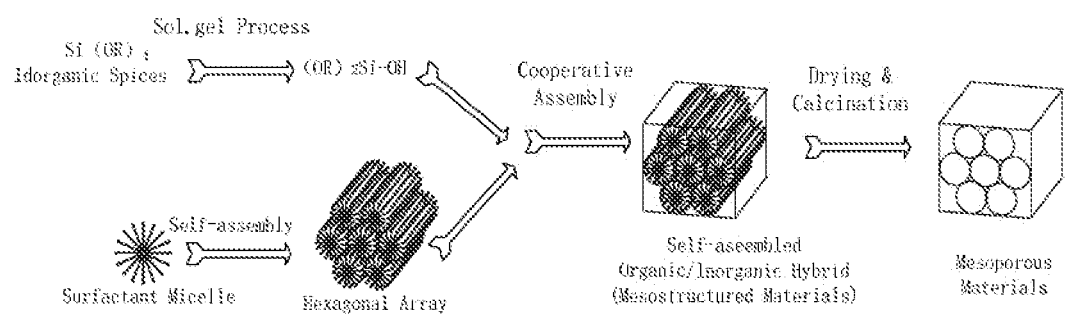
FIG. 3 is a schematic view showing steps of forming a mesoporous material in a display panel according to an embodiment of the present application.

As an another embodiment of the present application, as shown in FIGS. 1-3, the display panel includes a substrate 10; an active switch, which includes a first active switch and a second active switch, is disposed on the substrate 10 and includes an indium gallium zinc oxide layer 53; a pixel, which is disposed on the substrate 10 and coupled to the first active switch and includes a quantum dot light-emitting diode; and a light sensor, which is disposed on the substrate 10 and coupled to the second active switch and includes a quantum dot light sensing layer. The quantum dot light-emitting diode 21 includes a cathode layer 23, a quantum dot film layer 24, and an anode layer 25 which are sequentially arranged from the direction of the substrate 10, a cathode of the quantum dot film is a cathode layer 23. The active switch includes a gate layer 51, a gate insulating layer 52, the indium gallium zinc oxide (IGZO) layer 53, an etch stop layer 54, a metal layer 55, and a pixel electrode layer 56 which are sequentially arranged on the substrate. The quantum dot light-emitting diode is disposed above the etch stop layer 54, the quantum dot film layer 24 is disposed between the metal layer 55 and the pixel electrode layer 56, the pixel electrode layer 56 is used as an anode of the quantum dot film layer 24, and the metal layer 55 serves as a cathode of the quantum dot film layer 24.

The quantum dot light sensing layer 27 typically contains materials for fabricating light sensors such as photodiodes, and at the same time the quantum dot light sensing layer has spectral adjustability and environmental stability. The light sensor 22 includes a cathode layer 26, The quantum dot light sensing layer 27 and an anode layer 25. The indium gallium zinc oxide layer serves as a channel layer in the active switch, and the indium gallium zinc oxide is amorphous, which solves the problem that the grain size limits the uniformity of the panel. At the same time, its driving voltage is very low and can be less than 1 V, thereby saving electricity and energy. By reasonable use of the device, the display taste is improved and the user's visual experience is enhanced. The coupling of the QLED as the pixel and the active switch is achieved by the application form of the metal layer 55 and the pixel electrode layer 56. An active switch can be coupled to a corresponding pixel, which can be utilized reasonably to reduce occupied space and reduce cost while playing normal functions of the two devices. Via holes are formed in the etch stop layer 54, and the metal layer 55 is connected to the indium gallium zinc oxide layer 53 through the via holes.

The quantum dot film layer 24 includes a hole injection layer, a hole transport layer, a quantum dot light-emitting layer, an electron transport layer, and an electron injection layer which are sequentially arranged. The hole injection layer is disposed on a side close to the substrate 10, and the electron injection layer is disposed on a side away from the substrate 10. From charge injection, first, when a positive outward bias is applied, holes and electrons overcome interface energy barrier, are injected through an anode and a cathode, and enter the valence band level of the hole transport layer and a conduction band of the electron transport layer respectively; then, under external driving, the holes and the electrons are transmitted through the hole transport layer and the electron transport layer to reach the quantum dots of the light-emitting layer; at this time, due to the energy level difference of the interface, the interface has a charge accumulation; and finally, after the electrons and the holes converge in quantum dots and are recombined, an exciton is formed. The sub-excited state is unstable in the general environment. The energy will be released in the form of light or heat and return to a stable ground state, and thus electroluminescence is a current-driven phenomenon.

As shown in FIG. 2, the quantum dot light sensing layer 24 includes a mesoporous framework 3, the mesoporous framework 3 is a self-assembled mesoporous silica framework, and the mesoporous framework 3 is provided with holes 31 therein. An organic template is disposed in the hole 31, and a slit is formed between the organic template and the inner wall of the hole 31; and the quantum dots are disposed in the slit. The quantum dot light-emitting layer includes a mesoporous framework 3, the mesoporous framework 3 is a self-assembled mesoporous silica framework, and the mesoporous framework 3 is provided with holes 31 therein. An organic template is disposed in the hole 31, and a slit is formed between the organic template and the inner wall of the hole 31; and the quantum dot is disposed in the slit. By arranging quantum dots in the mesoporous framework 3 and adjusting and controlling the sizes of the quantum dots and the uniformity of arrangement thereof and adjusting the light-emitting diodes having different illuminating colors due to different quantum dot sizes, the uniformity of the light having different illuminating colors in the active illuminating display panel can be achieved, thereby improving the display taste and the user's visual experience. This is a specific silica frame structure, and the use of the structure of the hole 31 facilitates the implementation of a self-assembled molecular template solution oxide. The molecular template has a good shaping effect, and the quantum dots can be more evenly dispersed in the slit formed between the organic template and the inner wall of the hole 31. Hydroxyl groups are combined with the materials employed by the quantum dots by van der Waals forces to form quantum dots in the mesoporous framework 3. The hole 31 has a diameter of 2-7 nm; the inner wall of the hole 31 is a silicon dioxide hole wall 32, and the hole wall 32 has a thickness of 1-2 nm.

Optionally, the holes include a plurality of first holes, second holes and third holes, where the diameter of the second hole is smaller than that of the first hole, and the diameter of the third hole is smaller than that of the second hole. Specifically, the diameter of the first hole may be 5-7 nm, the diameter of the second hole is 3.5-5 nm, the diameter of the third hole is 2-3.5 nm, and materials forming the hole wall or the like may be the same or different, as long as the materials are suitable. In this way, the diameter of the hole is large, and the small hole and the large hole can be combined with quantum dots or other materials having different molecular material sizes, respectively, thereby expanding the scope of application of the present invention.

The quantum dots are made of a III-V compound semiconductor material nano material, and the III-V compound semiconductor material includes gallium arsenide;

alternatively, the quantum dots are made of gallium nitride nanomaterials;

alternatively, the quantum dots are made of indium gallium zinc oxide nanomaterials;

alternatively, the quantum dots are made of silicon nanomaterials;

alternatively, the quantum dots are made of germanium nanomaterials; the quantum dots are made of any combination of the above nanomaterials or any of the above nanomaterials.

The organic template is made of a III-V compound semiconductor material, and the II-V compound semiconductor material includes gallium arsenide; or the organic template is made of gallium nitride; or the organic template is made of silicon; or the organic template is made of ruthenium; or the organic template is made of silicon germanium; and the organic template is made of any combination of the above materials or any of the above materials.

The radius of the quantum dot is smaller than or equal to the exciton Bohr radius. Since the radius is smaller than or equal to the exciton Bohr radius of the material, the quantum dots have a very significant quantum confinement effect. In quantum dots with small physical dimensions, since the movement of carriers in all directions is limited, the original continuous energy band structure will become a quasi-discrete energy level, which will increase the effective band gap of the material and then radiate photons with higher energy and shorter wavelengths. It is not difficult to see that for quantum dots of the same material, as the physical size reduces continuously, the emission spectrum can achieve the transition from red light to blue light, which also creates the most striking feature of quantum dots—spectral adjustability. In addition, the quantum dot emission spectrum has a narrow half peak width and good color purity and color saturation. Moreover, the quantum dots are made of inorganic semiconductor materials with environmental stability that organic chromophores cannot achieve. The quantum dots adopt a III-V such as GaAs and GaN, Si, Ge, and SiGe as a guest to make hydroxyl group (—OH) function groups converted into a framework portion of mesoporous silica on the surface of the hole 31.

As shown in FIG. 3, inorganic fragrance Si(OR) 4 is converted into Si(OR)3Si—OH by a sol-gel process, and on the other hand, surfactant micelles are arranged into a hexagonal micelle rod by self-assembly techniques. The hexagonal micelle rod and Si(OR)3Si—OH are self-assembled by a synergistic assembly technique to form an organic/inorganic hybrid mesoporous structure material, which is then dried and calcined to form a mesoporous material.

Specifically, the light sensor is a PIN type photodiode. The PIN type photodiode includes a P-type semiconductor layer, an intrinsic semiconductor layer, and an N-type semiconductor layer which are sequentially arranged from the direction of the substrate.

Specifically, the active switch can adopt a thin film transistor.

Figure 4:
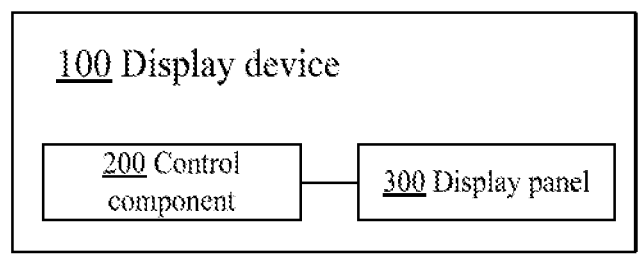
FIG. 4 is a schematic diagram of a display device according to an embodiment of the present application.
Figure 5:
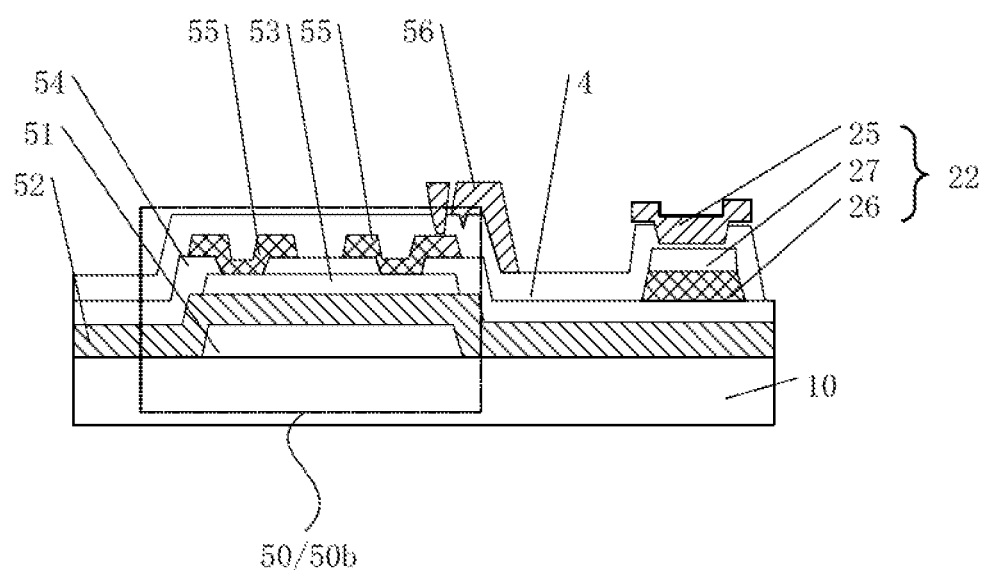
FIG. 5 is a schematic structural view of a second active switch of a display panel and a light sensor of a display panel according to an embodiment of the present application.

As a further embodiment of the present application, referring to FIG. 4, this embodiment discloses a display device 100. The display device 100 includes a control unit 200 and the display panel 300 of the present application. The display panel is taken as an example for detailed description above. It should be noted that the above description of the structure of the display panel is also applicable to a display device of the embodiment of the present application. When the display device of the embodiment of the present application is a liquid crystal display, the liquid crystal display includes a backlight module, and the backlight module can be used as a light source for providing sufficient brightness and light with uniform distribution. The backlight module of this embodiment can be of a front light type, may also be of a backlight type. It should be noted that the backlight module of this embodiment is not limited thereto.

The above are further detailed descriptions of the present application in conjunction with the specific embodiments, but the embodiments of the present application are not limited to these descriptions. For a person skilled in the art to which the present application pertains, a number of simple deductions or substitutions may also be made without departing from the concept of the present application. All these should be considered as falling within the scope of protection of the present application.

What is claimed is:

1. A display panel, comprising:
   a substrate;
   an active switch, which is disposed on the substrate and comprises a first active switch and a second active switch;
   a pixel, which is disposed on the substrate and coupled to the first active switch and comprises a quantum dot light-emitting diode; and
   a light sensor, which is disposed on the substrate and coupled to the second active switch and comprises a quantum dot light sensing layer;
   wherein the active switch comprises a gate layer, a gate insulating layer, an indium gallium zinc oxide layer, an etch stop layer, a metal layer, and a pixel electrode layer which are sequentially arranged on the substrate.

2. The display panel according to claim 1, wherein the light sensor is a PIN type photodiode.

3. The display panel according to claim 1, wherein the quantum dot light-emitting diode comprises a cathode layer, a quantum dot film layer, and an anode layer which are sequentially arranged from the direction of the substrate.

4. The display panel according to claim 3, wherein the quantum dot light-emitting diode is disposed above the etch stop layer, the quantum dot film is disposed between the metal layer and the pixel electrode layer, the pixel electrode layer is used as an anode of the quantum dot film, and the metal layer serves as a cathode of the quantum dot film.

5. The display panel according to claim 4, wherein via holes are formed in the etch stop layer, and the metal layer is connected to the indium gallium zinc oxide layer through the via holes.

6. The display panel according to claim 1, wherein the quantum dot light-emitting diode comprises a cathode layer, a quantum dot film, and an anode layer which are sequentially arranged from the direction of the substrate;
   the quantum dot light-emitting diode is disposed above the etch stop layer, the quantum dot film is disposed between the metal layer and the pixel electrode layer, the pixel electrode layer is used as an anode of the quantum dot film, and the metal layer serves as a cathode of the quantum dot film;
   via holes are formed in the etch stop layer, and the metal layer is connected to the indium gallium zinc oxide layer through the via holes.

7. The display panel according to claim 1, wherein the quantum dot light sensing layer comprises a mesoporous framework, the mesoporous framework is a self-assembled mesoporous silica framework, holes are formed m the mesoporous framework, and quantum dots are disposed in the holes.

8. The display panel according to claim 7, wherein the hole has a diameter of 2-7 nm.

9. The display panel according to claim 7, wherein the inner wall of the hole is a silicon dioxide hole wall, and the hole wall has a thickness of 1-2 nm.

10. The display panel according to claim 7, wherein the holes comprise a plurality of first holes, second holes and third holes, wherein the diameter of the second hole is smaller than that of the first hole, and the diameter of the third hole is smaller than that of the second hole.

11. The display panel according to claim 1, wherein the quantum dot light-emitting diode comprises a cathode layer, a quantum dot film, and an anode layer which are sequentially arranged from the direction of the substrate;
    the quantum dot light-emitting diode is disposed above the etch stop layer, the quantum dot film is disposed between the metal layer and the pixel electrode layer, the pixel electrode layer is used as an anode of the quantum dot film, and the metal layer serves as a cathode of the quantum dot film;
    via holes are formed in the etch stop layer, and the metal layer is connected to the indium gallium zinc oxide layer through the via holes;
    the quantum dot light sensing layer comprises a mesoporous framework, the mesoporous framework is a self-assembled mesoporous silica framework, holes are formed in the mesoporous framework, and quantum dots are disposed m the holes;
    the hole has a diameter of 2-7 nm;
    the inner wall of the hole is a silicon dioxide hole wall, and the hale wall has a thickness of 1-2 nm.

12. A display panel, comprising:
    a substrate;
    an active switch, which is disposed on the substrate, comprises a first active switch and a second active switch, and comprises an indium gallium zinc oxide layer;
    a pixel, which is disposed on the substrate and coupled to the first active switch and comprises a quantum dot light-emitting diode; and
    a light sensor, which is disposed on the substrate and coupled to the second active switch and comprises a quantum dot light sensing layer;

wherein the quantum dot light-emitting diode comprises a cathode layer, a quantum dot film, and an anode layer which are sequentially arranged from the direction of the substrate;

wherein the active switch comprises a gate layer, a gate insulating layer, the indium gallium zinc oxide layer, an etch stop layer, a metal layer, and a pixel electrode layer which are sequentially arranged on the substrate;

the quantum dot light-emitting diode is disposed above the etch stop layer, the quantum dot film is disposed between the metal layer and the pixel electrode layer, the pixel electrode layer is used as an anode of the quantum dot film, and the metal layer serves as a cathode of the quantum dot film.

13. A display device, comprising:
a control component and a display panel;
the display panel comprises:
a substrate;
an active switch, which is disposed on the substrate and comprises a first active switch and a second active switch;
a pixel, which is disposed on the substrate and coupled to the first active switch and comprises a quantum dot light-emitting diode; and
a light sensor, which is disposed on the substrate and coupled to the second active switch and comprises a quantum dot light sensing layer;
wherein the active switch comprises a gate layer, a gate insulating layer, an indium gallium zinc oxide layer, an etch stop layer, a metal layer, and a pixel electrode layer which are sequentially arranged on the substrate.

14. The display device according to claim 13, wherein the light sensor is a PIN type photodiode.

15. The display device according to claim 13, wherein the quantum dot light-emitting diode comprises a cathode layer, a quantum dot film, and an anode layer which are sequentially arranged from the direction of the substrate; the quantum dot light-emitting diode is disposed above the etch stop layer, the quantum dot film is disposed between the metal layer and the pixel electrode layer, the pixel electrode layer is used as an anode of the quantum dot film, and the metal layer serves as a cathode of the quantum dot film.

16. The display device according to claim 15, wherein via holes are formed in the etch stop layer, and the metal layer is connected to the indium gallium zinc oxide layer through the via holes.

17. The display device according to claim 13, wherein the quantum dot light-emitting diode comprises a cathode layer, a quantum dot film, and an anode layer which are sequentially arranged from the direction of the substrate;

the quantum dot light-emitting diode is disposed above the etch stop layer, the quantum dot film is disposed between the metal layer and the pixel electrode layer, the pixel electrode layer is used as an anode of the quantum dot film, and the metal layer serves as a cathode of the quantum dot film;

via holes are formed in the etch stop layer, and the metal layer is connected to the indium gallium zinc oxide layer through the via holes.

18. The display device according to claim 13, wherein the quantum dot light sensing layer comprises a mesoporous framework, the mesoporous framework is a self-assembled mesoporous silica framework, boles are formed m the mesoporous framework, and quantum dots are disposed in the holes.

19. The display device according to claim 13, wherein the hole has a diameter of 2-7 nm;
the inner wall of the hole is a silicon dioxide hole wall, and the hole wall has a thickness of 1-2 nm.

20. The display device according to claim 13, wherein the quantum dot light-emitting diode comprises a cathode layer, a quantum dot film, and an anode layer which are sequentially arranged from the direction of the substrate;

the quantum dot light-emitting diode is disposed above the etch stop layer, the quantum dot film is disposed between the metal layer and the pixel electrode layer, the pixel electrode layer is used as an anode of the quantum dot film, and the metal layer serves as a cathode of the quantum dot film;

via holes are formed in the etch stop layer, and the metal layer is connected to the indium gallium zinc oxide layer through the via holes;

the quantum dot light sensing layer comprises a mesoporous framework, the mesoporous framework is a self-assembled mesoporous silica framework, holes are formed in the mesoporous framework, and quantum dots are disposed in the holes;

the hole has a diameter of 2-7 nm;

the inner wall of the hole is a silicon dioxide bole wall, and the hale wall has a thickness of 1-2 nm;

the holes include a plurality of first holes, second holes and third holes, wherein the diameter of the second hole is smaller than that of the first hole, and the diameter of the third hole is smaller than that of the second hole.

* * * * *